(12) United States Patent
Chen et al.

(10) Patent No.: US 9,137,928 B2
(45) Date of Patent: Sep. 15, 2015

(54) PLANAR HEAT DISSIPATION STRUCTURE AND ELECTRONIC DEVICE UTILIZING THE SAME

(71) Applicants: LITE-ON ELECTRONICS (GUANGZHOU) LIMITED, Guangzhou (CN); LITE-ON TECHNOLOGY CORPORATION, Taipei (TW)

(72) Inventors: Wen-Chi Chen, Taipei (TW); Yi-Jen Lu, Yilan County (TW); Ya-Tung I, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 269 days.

(21) Appl. No.: 13/927,204

(22) Filed: Jun. 26, 2013

(65) Prior Publication Data

US 2014/0009891 A1 Jan. 9, 2014

(30) Foreign Application Priority Data

Jul. 9, 2012 (CN) .......................... 2012 1 0234284

(51) Int. Cl.
*H05K 7/20* (2006.01)
(52) U.S. Cl.
CPC .......... *H05K 7/2039* (2013.01); *H05K 7/20436* (2013.01)
(58) Field of Classification Search
CPC ....................... H05K 7/20436; H05K 7/20445
See application file for complete search history.

(56) References Cited

U.S. PATENT DOCUMENTS

| 3,008,385 | A | * | 11/1961 | Pierce, Jr. ...................... 493/124 |
| 5,258,888 | A | * | 11/1993 | Korinsky ....................... 361/704 |
| 5,287,001 | A | * | 2/1994 | Buchmann et al. ........... 257/719 |
| 6,101,095 | A | * | 8/2000 | Yamaguchi ................... 361/720 |
| 6,570,086 | B1 | * | 5/2003 | Shimoji et al. ................ 174/377 |
| 6,696,643 | B2 | * | 2/2004 | Takano ......................... 174/520 |
| 6,809,932 | B2 | * | 10/2004 | Wu ................................ 361/719 |
| 6,816,377 | B2 | * | 11/2004 | Itabashi et al. ................ 361/704 |
| 6,881,077 | B2 | * | 4/2005 | Throum ....................... 439/76.1 |
| 6,977,815 | B2 | * | 12/2005 | Hsu ................................ 361/704 |
| 7,031,165 | B2 | * | 4/2006 | Itabashi et al. ................ 361/719 |

(Continued)

FOREIGN PATENT DOCUMENTS

WO WO 2012050291 A1 * 4/2012 ............... H05K 7/20

*Primary Examiner* — Robert J Hoffberg
(74) *Attorney, Agent, or Firm* — Li & Cai Intellectual Property (USA) Office

(57) ABSTRACT

The instant disclosure relates to a planar heat dissipation structure, which comprises a first electrically insulating and thermally conductive layer having a thermal conductivity coefficient greater than 0.5 W/mK and a metal layer chemically bonded to and in thermal contact with the first electrically insulating and thermally conductive layer. The planar heat dissipation structure forms a one-piece structure that is configurable from a substantially planar collapsed state to a folded three-dimensional state, and defines a base portion and at least one flap portion configured to be foldable with respect to the base portion thereon, such that the first electrically insulating and thermally conductive layer constitutes an inner surface of the planar heat dissipation structure to define a covering space. The instant disclosure also discloses an electronic device that utilizes said foldable planar heat dissipation structure.

14 Claims, 14 Drawing Sheets

(56) References Cited

U.S. PATENT DOCUMENTS

| | | | |
|---|---|---|---|
| 7,082,034 B2 * | 7/2006 | Tiwari et al. | 361/719 |
| 7,180,745 B2 * | 2/2007 | Mandel et al. | 361/719 |
| 7,239,519 B2 * | 7/2007 | Guo et al. | 361/714 |
| 7,242,585 B2 * | 7/2007 | Fukuma et al. | 361/719 |
| 7,324,345 B2 * | 1/2008 | Lee et al. | 361/719 |
| 7,352,585 B2 * | 4/2008 | Mandel et al. | 361/714 |
| 7,663,883 B2 * | 2/2010 | Shirakami et al. | 361/700 |
| 8,363,407 B2 * | 1/2013 | Yamamoto et al. | 361/705 |
| 2002/0029875 A1 * | 3/2002 | Takano | 165/185 |
| 2005/0152118 A1 * | 7/2005 | Cho | 361/707 |
| 2007/0115644 A1 * | 5/2007 | Kim et al. | 361/720 |
| 2011/0171480 A1 * | 7/2011 | Mori et al. | 428/447 |
| 2012/0147565 A1 * | 6/2012 | I et al. | 361/720 |
| 2012/0263949 A1 * | 10/2012 | Wollack et al. | 428/355 BL |
| 2012/0307455 A1 * | 12/2012 | Ritter et al. | 361/720 |
| 2013/0058695 A1 * | 3/2013 | Jensen et al. | 400/76 |
| 2013/0063895 A1 * | 3/2013 | Ritter et al. | 361/692 |
| 2013/0188318 A1 * | 7/2013 | I et al. | 361/713 |

\* cited by examiner

PLANAR HEAT DISSIPATION STRUCTURE AND ELECTRONIC DEVICE UTILIZING THE SAME

BACKGROUND

1. Field of the Invention

The instant disclosure relates to a planar heat dissipation structure; in particular, to a foldable planar heat dissipation structure that is easy to store and transport when in a default two-dimensional collapsed state, and capable of being folded to create a three-dimensional heat dissipation structure that evenly, rapidly cools down circuit boards/electrical components in an electronic device. The instant disclosure also relates to an electronic device that utilizes said foldable planar heat dissipation structure.

2. Description of Related Art

Adapters and power supply devices are essential electronic devices for the operation of various electrical appliances and equipment. Such electronic devices may have many electrical components disposed on the circuit board therein. These electrical components not only include components of high power consumption such as transformers, metal-oxide-semiconductor field effect transistors (MOSFET), diodes and inductors, but also include components of low power consumption such as capacitors and resistors. When the electronic device is at work, if the heat generated by the electrical components therein cannot be dissipated effectively, the heat will be accumulated in the electronic device and causes the temperature of the electrical components to rise. Once the temperature of the electrical components gets too high, the electrical components may operate abnormally or even burnt out.

Take an adapter for example, it is used to convert an external voltage into the voltage required by an electronic appliance such as a portable computer. However, as the size of the adapter becomes smaller as electrical components therein become further integrated, heat dissipation has become a more serious problem.

For example, the casing of a conventional adapter is made of plastic. Because the material of plastic is unfavorable for heat dissipation, when the heat generated by the electrical components on the circuit board is transferred to the casing, the temperature on the regions of the casing corresponding to the components of high power consumption is usually higher than the temperatures on other regions of the casing. The high temperature at a specific region of the casing may cause a user to feel uncomfortable or even get burnt. Furthermore, the heat dissipation efficiency of the casing will be reduced because the heat is concentrated at the specific region of the casing.

Furthermore, as the size of electronic devices become shrinks, the space inside the electronic device reduces. Deducting the space required for electrical components inside the electronic device, the remaining space available for a heat dissipation structure is further limited. Therefore, it is more difficult to design the heat dissipation structure in such a limited space.

In summary, a better solution is needed to provide an improved heat dissipation structure that effectively evens the temperature distribution in an electronic device, occupies minimum interior space, has higher manufacturing efficiency, and is easy to store and transport.

SUMMARY OF THE INVENTION

The object of the instant disclosure is to provide a planar heat dissipation structure and an electronic device using the same. The planar heat dissipation structure has a default collapsed configuration, making it easily stored and transported. Upon folding, the planar heat dissipation structure transforms into a three-dimensional configuration that can be arranged inside the electronic device.

The instant disclosure provides the planar heat dissipation structure which comprises a first electrically insulating and thermally conductive layer having a thermal conductivity coefficient of greater than 0.5 W/mK, and a metal layer. The first electrically insulating and thermally conductive layer and the metal layer are arranged in thermal contact and combined to form an integral structure. On the other hand, the planar heat dissipation structure has a base portion and at least one flap portion defined thereon. The flap portion is configured to be foldable toward the base portion such that the first electrically insulating and thermally conductive layer forms an inner surface of the folded planar heat dissipation structure, which defines a covering space for fully or partially covering/accommodating various electrical components of an electronic device.

The instant disclosure provides another application of the planar heat dissipation structure. The folded planar heat dissipation structure is arranged inside a casing of an electronic device. The covering space formed by the folded planar heat dissipation structure selectively covers a circuit board, and at least one electrical component. The planar heat dissipation structure comprises a first electrically insulating and thermally conductive layer, which has a thermal conductivity coefficient of greater than 0.5 W/mK, and a metal layer. The first electrically insulating and thermally conductive layer and the metal layer are combined to form a thermally contacting integrated structure. The planar heat dissipation structure further comprises a base portion and at least one flap portion. The flap portion is configured to be foldable toward the base portion to form a covering space within the first electrically insulating and thermally conductive layer.

The instant disclosure further provides an electronic device using the planar heat dissipation structure. The electronic device comprises a circuit board, at least one electrical component electrically disposed on the circuit board and a folded planar heat dissipation structure. The folded planar heat dissipation structure comprises a first electrically insulating and thermally conductive layer, which has a thermal conductivity coefficient of greater than 0.5 W/mK, and a metal layer. The first electrically insulating and thermally conductive layer and the metal layer are combined to form a thermally contacting integrated structure. The planar heat dissipation structure further comprises a base portion and at least one flap portion. The flap portion is configured to be foldable toward the base portion. The first electrically insulating and thermally conductive layer selectively covers the circuit board and at least one electrical component. The electronic device also comprises a casing defining an accommodating space for receiving the circuit board, the electrical component, and the folded planar heat dissipation structure. The metal layer is thereby arranged between the inner surface of the casing and the first electrically insulating and thermally conductive layer.

According to one exemplary embodiment of the instant disclosure, the metal layer is in thermal contact with and chemically bonded to the first electrically insulating and thermally conductive layer.

In another exemplary embodiment of the instant disclosure, the first electrically insulating and thermally conductive layer further includes a coupling portion protruding from the first electrically insulating and thermally conductive layer toward the casing. The coupling portion penetrates through a hole on the metal layer. The coupling portion extends outside the hole to form as a rivet so that the metal layer is combined and fixed to the first electrically insulating and thermally conductive layer. And a one-piece heat dissipation structure is thus formed.

The planar heat dissipation structure in accordance with the instant disclosure is not only capable of facilitating increased production yield rate and effectively reducing manufacturing cost, but also enable easier storage and reduce transportation cost due to the fact that the planar profile thereof can be flatly stacked to offer a reduced pack volume. Moreover, the planar heat dissipation structure is suitable for use inside an electronic device with minimum spatial requirement.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The term "thermal contact" described herein refers to a combination way between two objects, where heat can be transferred from one object to the other object through thermal conduction.

In addition, the term "cover" described herein refers to a covering object partially or completely surrounds an object to-be-covered, where the covering object may or may not establish physical contact with the object to-be-covered.

First Embodiment

Figure 1:
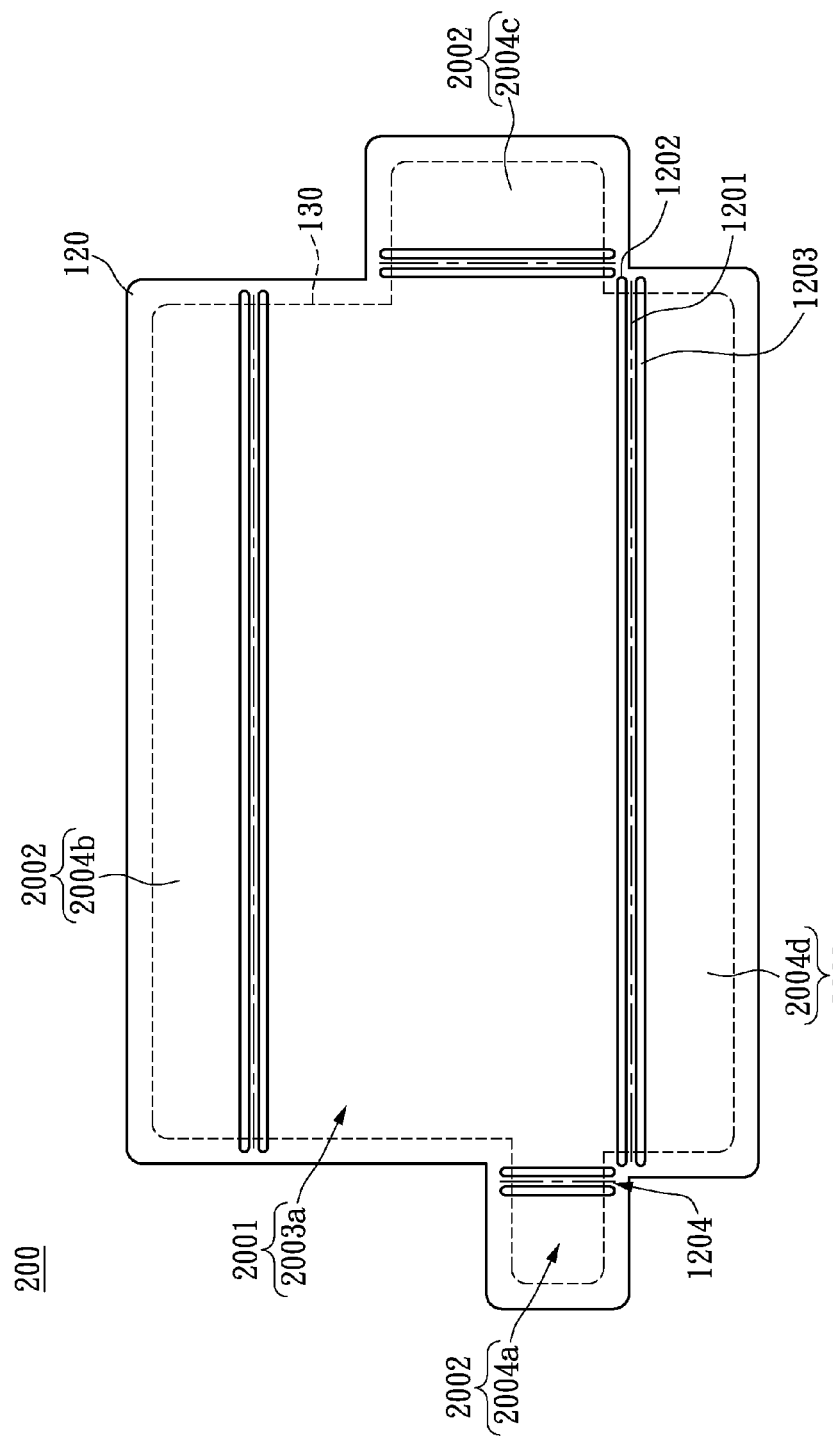
FIG. 1 illustrates a schematic diagram of a planar heat dissipation structure in accordance with a first embodiment of the instant disclosure.
Figure 2:
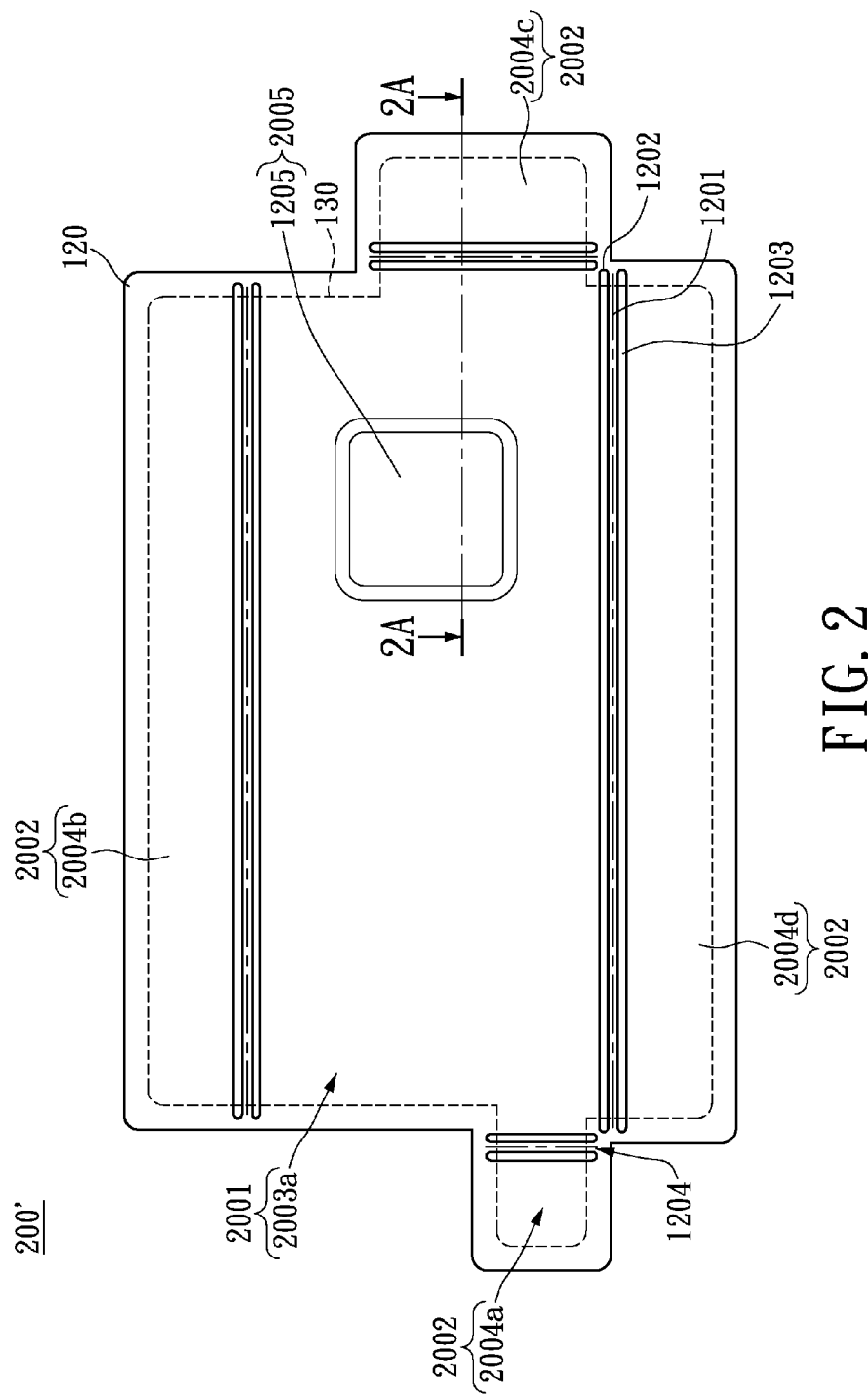
FIG. 2 illustrates a schematic diagram of a planar heat dissipation structure in accordance with another embodiment of the instant disclosure.
Figure 3:
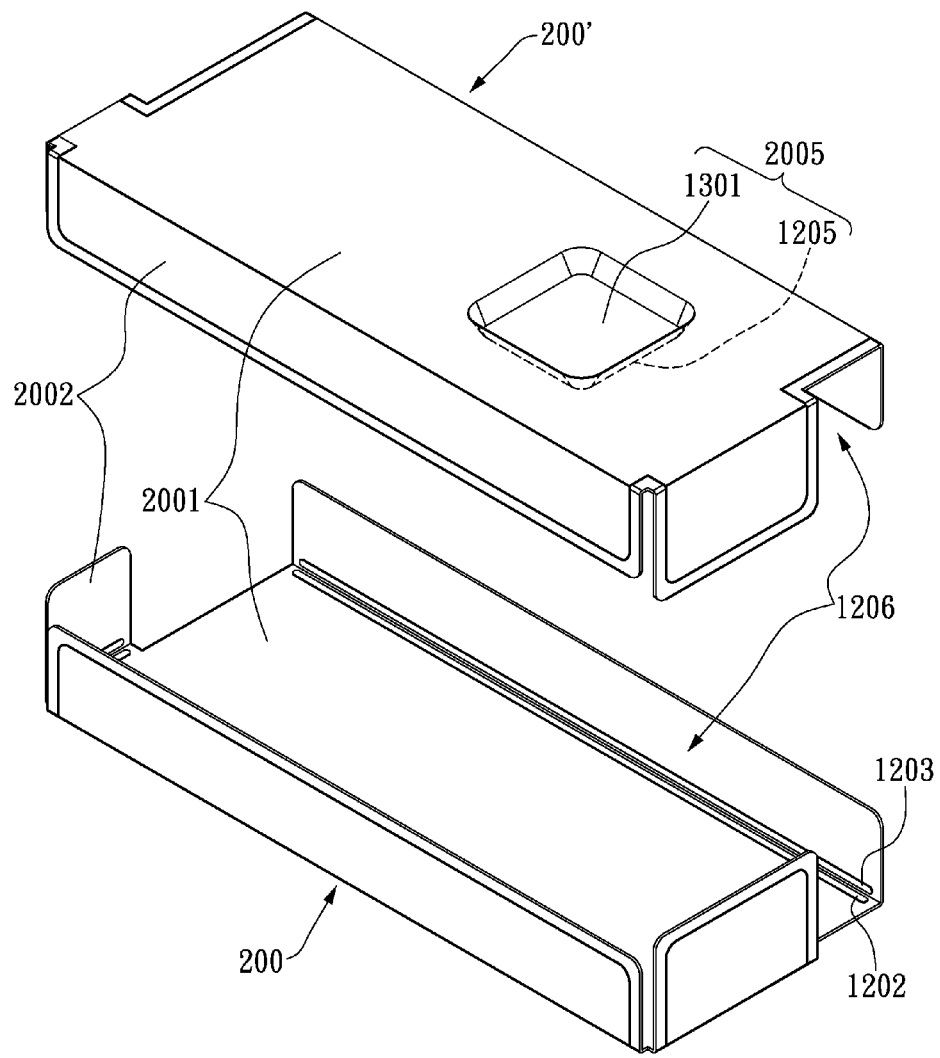
FIG. 3 illustrates a schematic diagram of the folded planar heat dissipation structure shown in FIG. 1 and FIG. 2.

FIG. 1~FIG. 3 illustrate one exemplary embodiment of a planar heat dissipation structure in accordance with the instant disclosure.

Please refer specifically to FIG. 1, which shows a planar heat dissipation structure 200 in a default two-dimensional unfolded state. The planar heat dissipation structure 200 comprises a first electrically insulating and thermally conductive layer 120 (for the ease of reference, the term "first insulating layer" 120 is used interchangeably) and a metal layer 130. The metal layer 130 and the first electrically insulating and thermally conductive layer 120 are structurally integrated and thermal-conductively coupled to form the one-piece-style planar heat dissipation structure 200.

The first electrically insulating and thermally conductive layer 120 has a thermal conductivity coefficient greater than 0.5 W/mK, and is preferably a soft material. For instance, the first electrically insulating and thermally conductive layer 120 can be made of heat conductive silicone, heat conductive rubber, and other suitable materials. The metal layer 130 may be made of aluminum, ferrum, copper, or other suitable materials. As the first electrically insulating and thermally conductive layer 120 is made of soft and heat conductive materials such as heat conductive silicone or rubber, the structural integration with the metal layer 130 can provide resultant planar heat dissipation structure 200 with sufficient rigidity, thereby retaining the particular structural shape thereof.

Regarding the manufacture of the planar heat dissipation structure 200 in accordance with the instant disclosure, a metal layer 130 is processed to form a substantially planar structure with a particular shape according to specific heat dissipation requirement and/or particular formal requirement of the casing of an electronic device. The substantially planar metal layer 130 having the particular shape is then placed in a mould (not shown in the figure) to be combined with a first electrically insulating and thermally conductive layer 120. Specifically, the first electrically insulating and thermally conductive layer 120 is then combined with the metal layer 130 according to the particular shape of the metal layer 130 (or according to other specific desirable shapes to be covered) to form the planar heat dissipation structure 200. It should be noted that, the size (area) of the first electrically insulating and thermally conductive layer 120 and the metal layer 130 does not have to be same. In fact, the planar area of the metal layer is preferably to be equal to or smaller than the planar area of the first electrically insulating and thermally conductive layer to ensure secure electrical insulation, while utilizing the metal layer 130 at specific locations of the electrically insulating and thermally conductive layer to provide structural rigidity (e.g. at the folding/score portion) and/or provide enhanced heat dissipating property. In this embodiment, the planar heat dissipation structure 200 has a base portion 2001 and at least one flap portion 2002 defined thereon. The flap portion 2002 is configured to be foldable with respect to the base portion 2001, thereby allowing the planar heat dissipation structure 200 to form a three dimensional heat dissipation structure in a folded configuration. Preferably, the metal layer 130 is arranged on one side of the first electrically insulating and thermally conductive layer (which is made of materials such as heat conductive silicone or rubber) at locations that spans across at least one border between the base portion 2001 and the flap portion 2002 (e.g., the score line), thus providing additional structural supporting for the flap portion 2002 upon folding, at the same time assisting in the shape retention in the folded state.

In the instant embodiment, the combination between the first electrically insulating and thermally conductive layer 120 and metal layer 130 is through chemical treatment, and is particularly preferable through chemical bonding, thereby forming a one-piece integrated planar heat dissipation structure 200 that has the attribute of being an individual stand-alone component.

Figure 2A:
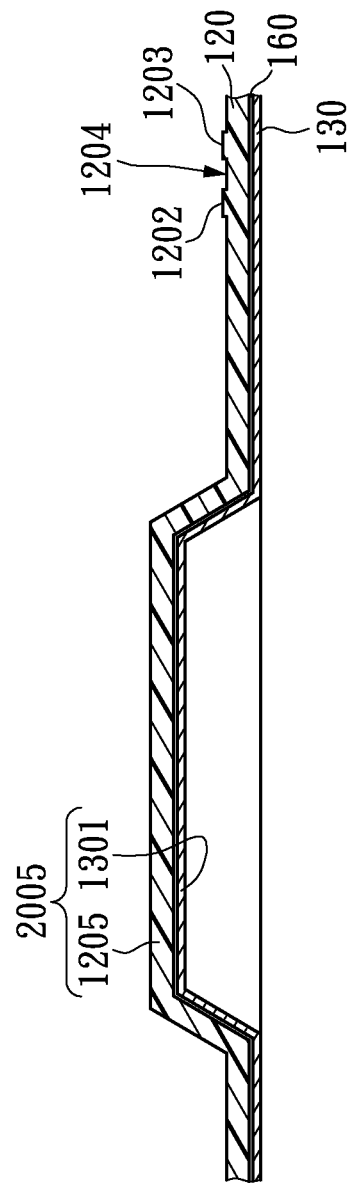
FIG. 2A illustrates a cross-sectional view along a 2A-2A line in the FIG. 2.

Regarding the aforementioned chemical bonding, the planar heat dissipation structure 200 further comprises a first adhesive 160 (as shown in FIG. 2A) which is coated (or otherwise uniformly disposed through suitable methods) on the first electrically insulating and thermally conductive layer 120. The first adhesive 160, which is disposed between the first electrically insulating and thermally conductive layer 120 and the metal layer 130, creates chemical bonding therebetween and thus structurally joining the two layers. In other words, the first adhesive 160 respectively chemically bonds the first electrically insulating and thermally conductive layer 120 and the metal layer 130. Specifically, the chemical bonding reactions may be, for example, crosslink or vulcanization. The first adhesive 160 can be a coupling agent such as a silane coupling agent or a titanate coupling agent. In the instant embodiment, the first electrically insulating and thermally conductive layer 120 is made of heat conductive silicone, the metal layer 130 is aluminum, and the first adhesive 160 is a silane coupling agent.

In the fabrication of the planar heat dissipation structure 200, during the chemical bonding process between the first electrically insulating and thermally conductive layer 120 and the metal layer 130, the flat sheet layer structures thereof allow even pressure and temperature distribution so as to shorten the bonding reaction time. Hence, the production rate is promoted while the cost is reduced.

The instant foldable planar composite heat dissipation structure offers several advantages in the manufacturing thereof compared to conventional three-dimensionally structured heat sink devices. For one thing, during the manufacturing process, if a metallic material (which has a comparably higher thermal conductivity coefficient) is formed into a conventional three-dimensional structure before the placement of electrically insulating and thermally conductive materials (such as heat-conducting silicone/rubber, which has a comparably lower thermal conductivity coefficient) into the mould to undergo a high temperature/pressure formation process for a duration of time, lateral edge area of the three-dimensional metal-layer structure may not be evenly pressured by the mould. As a result, effective bonding between the metal layer and the insulating layer may not be formed without a longer reaction time, which means less manufacturing efficiency and lower production rate. In contrast, the default planar layout of the instantly disclosed heat dissipation structure 200 allows uniform pressure distribution during the molding process, which in turn facilitates increased production rate compared to the conventional three-dimensional molding layout.

In addition to chemically bonding the first electrically insulating and thermally conductive layer 120 and the metal layer 130, physical combination can also be used, and the method of combination there-between is not limited thereto. In other words, other suitable methods of combination will be described in greater detail in the proceeding examples.

The first electrically insulating and thermally conductive layer 120 includes four score lines 1201 that define the boarders between the base portion 2001 and flap portion 2002. It should be noted that, for the purpose of the instant disclosure, the term "score line" discussed herein refers to a predetermined folding line that dictates a preferred folding pattern on a planar object, and may or may not be pre-treated to enable easy folding. While structural pre-treatment methods, such as pressing or scoring, may regionally weaken the predetermined folding pattern and thus enable easier folding, these treatments are not mandatorily required. In other words, the score/fold line referred herein may also be virtually defined boundaries. In the instant embodiment, the base portion 2001 is a base portion 2003a defined by the four score lines 1201. On the other hand, the number of flap portion 2002 in the instant embodiment has four flap portions 2004a, 2004b, 2004c and 2004d, each of which connects the base portion 2003a.

Figure 1A:
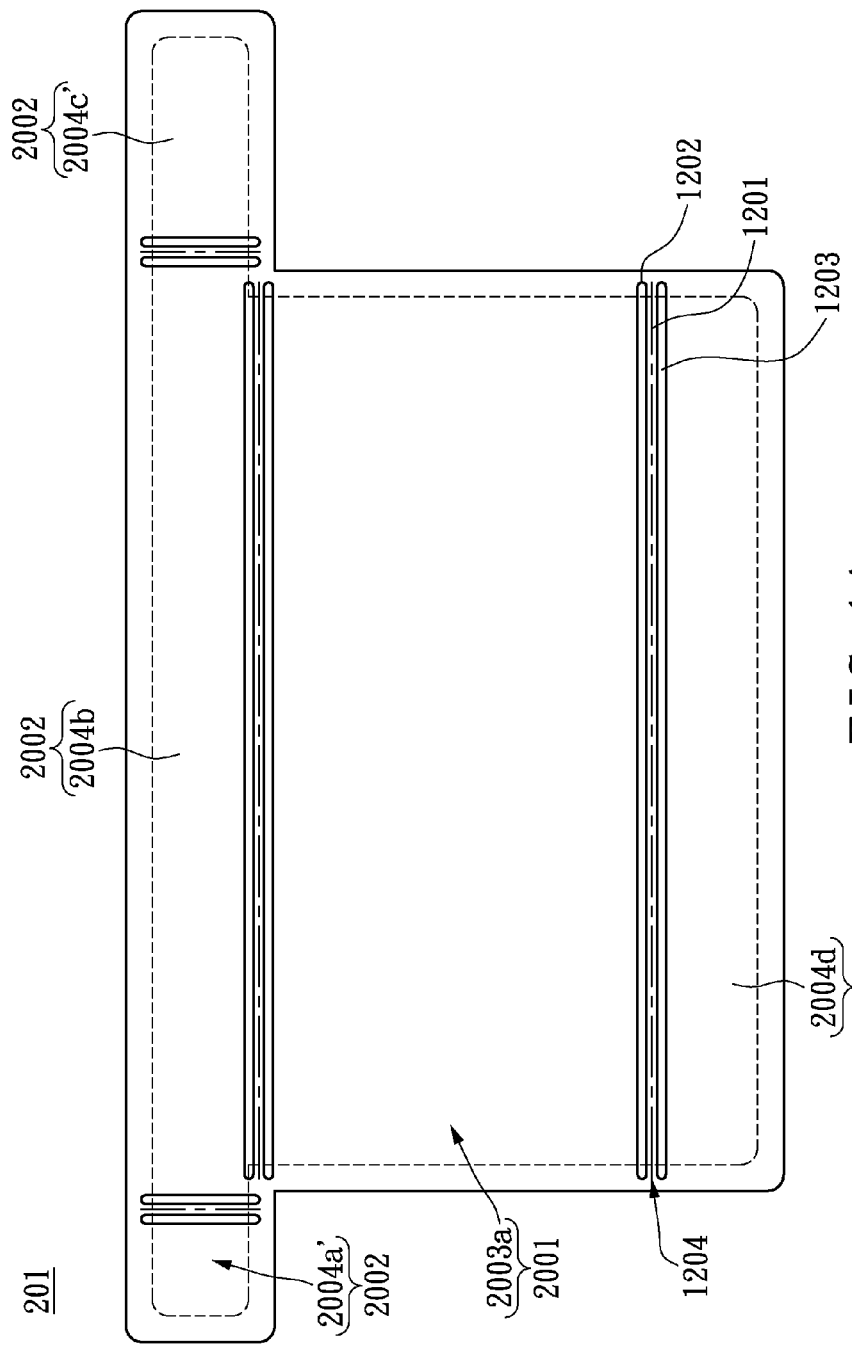
FIG. 1A illustrates a schematic diagram of an alternative arrangement for the planar heat dissipation structure in accordance with the first embodiment.

However, the number of score lines 1201 is not limited to four. As shown in FIG. 1A, the base plate 2003a of the planar heat dissipation structure 201 is surrounded by two score lines 1201 and the flat portion 2004b stretches toward opposite edges to form two flat portions 2004a' and 2004c' respectively. In addition, the score line 1201 can also be an annular fold to suit an object being covered.

Furthermore, the first electrically insulating and thermally conductive layer 120 includes a plurality of first ribs 1202 and a plurality of second ribs 1203. Each of the first ribs 1202 extends substantially parallelly along a score line 1201 on one side thereof (proximate the base portion), respectively. Likewise, each of the second ribs 1203 extends substantially parallelly along a score line 1201 on the other side thereof (proximate the flap portion). Preferably, the numbers of the first and second ribs 1202, 1203 respectively correspond to the number of the score lines 1201.

In more detail, the first ribs 1202 are disposed proximate to the base portion 2001 while the second ribs 1203 are disposed proximate to the flap portion 2001. The first and second ribs 1202, 1203 are substantially parallel to the corresponding score lines 1201 and a valley 1204 is formed between the first and second ribs 1202, 1203.

In addition to the aforementioned structure of the planar heat dissipation structure 200, another embodiment of the planar heat dissipation structure 200' is shown in FIG. 2. The difference between the planar heat dissipation structure 200 and 200' arises from a hollow protrusion 2005 formed on the planar heat dissipation structure 200'. The detail is described herein.

Please refer to FIG. 2A in conjunction with FIG. 3. In the fabrication of the planar heat dissipation structure 200', the metal layer 130 is a substantially planar structure formed with a hollow first bump portion 1301 according to the layout of an electrical component that produces large amount of heat in an electronic device. The metal layer 130 is then placed in a mould which conforms to the first bump portion 1301. The mould is configured to have an inner mould surface that generally conforms to the surface contour of the metal layer 130 and leaves a space above the metal layer for defining the shape (thickness) of the first electrically insulating and thermally conductive layer 120. The first electrically insulating and thermally conductive layer 120 is then formed on the metal layer 130 through the usage of the mould, thus forming a second bump portion 1205 thereon conforming to the first bump portion 1301. The first and second bump portions 1301, 1205 together form a protrusion 2005, which projects toward or abuts the corresponding electrical component, thereby establishing thermal contact.

Moreover, the projection 2005 can also be a supporter configured to hold or position a circuit board. In the embodiment shown in FIG. 2A, the projection 2005 is formed on the base portion 2001 whereas the arrangement of the projection 2005 can vary according to the layout of electrical components in an electronic device.

The flat structure of the planar heat dissipation structure 200 and 200' enables easier and compact stacking over one another, thus reducing packaging size, whereas the conventional three-dimensional heat dissipation structure has larger packaging size, which results in higher transportation cost and is prone to be damaged when tightly packed.

In addition, the planar heat dissipation structure 200 or 200' can be easily and conveniently arranged in an electronic device upon folding (preferably folded by a tool or other proper equipment into the three-dimensional configuration). For example, when the planar heat dissipation structure 200 or 200' is delivered to an factory for assembly, the flap portion 2002 thereof is folded toward the base portion 2001 along the score lines 1021 by a folding equipment (as shown in FIG. 3) into a three-dimensional structure, such that the three-dimensional structure comprising the first electrically insulating and thermally conductive layer 120 and the metal layer 130 defines a covering space 1206 that covers the associated components. The three-dimensional heat dissipation structure is then installed in the casing of an electronic device to cover a circuit board and/or one or more electrical component disposed thereon. Alternatively, as previously mentioned, the planar area of the first electrically insulating and thermally conductive layer is preferably equal or larger than that of the metal layer to obtain secure electrical insulation. Accordingly, when the instant heat dissipation structure is in the folded configuration, the first electrically insulating and thermally conductive layer 120 is arranged inside and constitutes an inner surface of the planar heat dissipation structure to define a covering space 1206. In this case, the metal layer 130 can be selectively rearranged at desirable locations on the insulating layer 120 arrangement according to particular design requirement, such as providing additional structural rigidity or enhanced heat dissipating properties.

The first and second ribs 1202, 1203, the first and second bump portions 1301, 1205 are structures that protrude toward the covering space 1206. When the flap portion 2002 is folded toward the base portion 2001, the valley 1204 is formed as a buffer between the first and second ribs 1202, 1203 for receiving the bulge of the first electrically insulating and thermally conductive layer 120 (as a result of folding) around the periphery the score lines 1201.

Figure 3A:
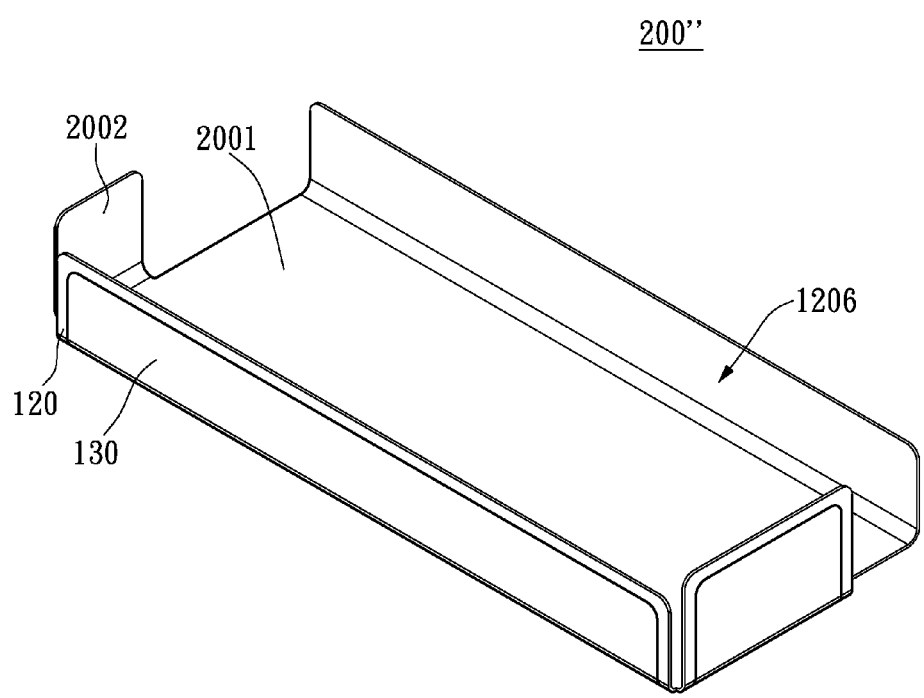
FIG. 3A illustrates a schematic diagram of a planar heat dissipation structure in accordance with another embodiment of the instant disclosure.

Please refer to FIG. 3A. The instant embodiment provides a rib-less planar heat dissipation structure 200" that does not require the use of the first and second ribs 1202, 1203, whereas the bulge does not appear along the folded regions. To achieve the rib-less design, the folded regions are processed to form a slightly curved profile to avoid concentrated stress and enhance the structural strength.

It is worth noted that the planar heat dissipation structures 200, 200', 200" are chosen according to user desire. For example, the user can select one type of the planar heat dissipation structure 200, 200', or 200" shown in FIGS. 3 and 3A, or any two types thereof to construct the whole heat dissipation structure.

Second Embodiment

Figure 4:
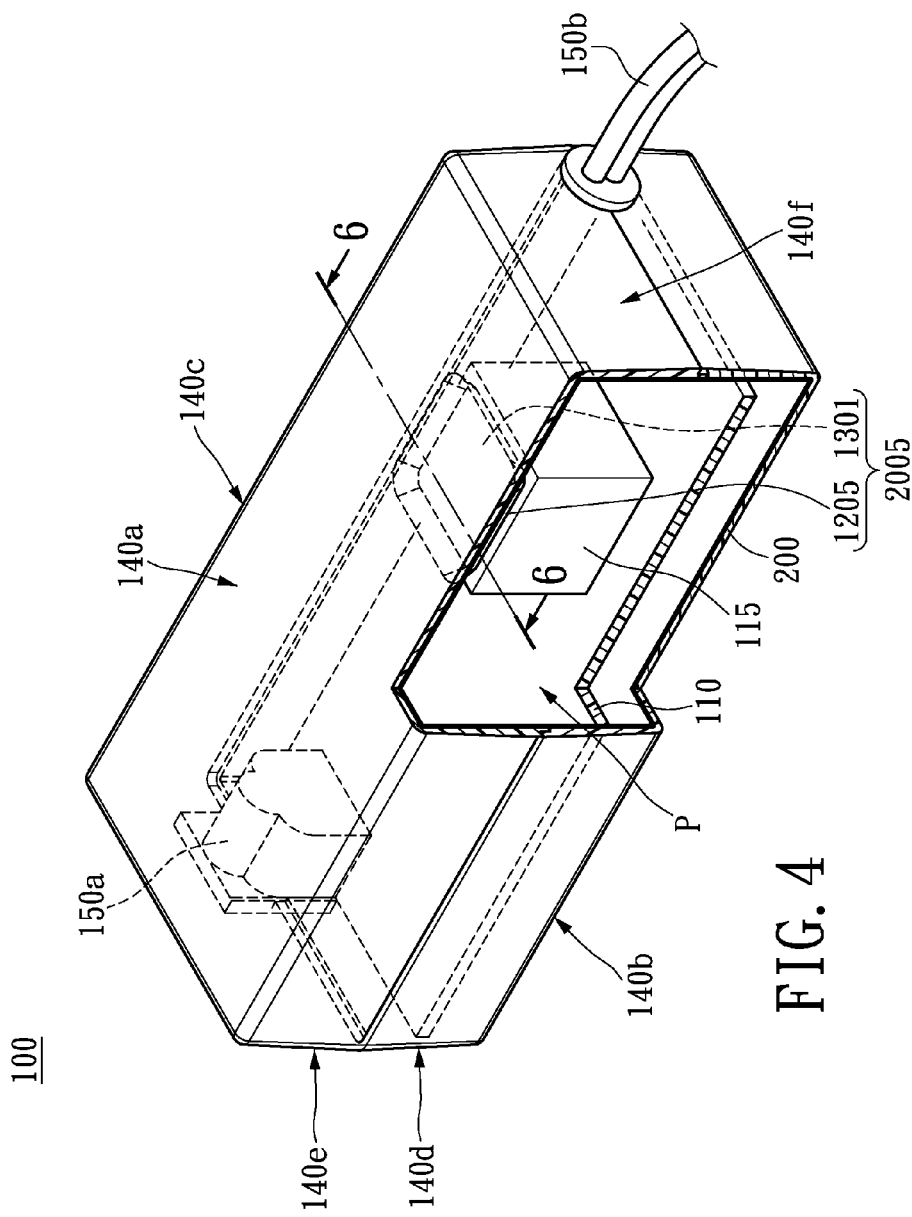
FIG. 4 illustrates a perspective view of an electronic device in accordance with a second embodiment of the instant disclosure.
Figure 5:
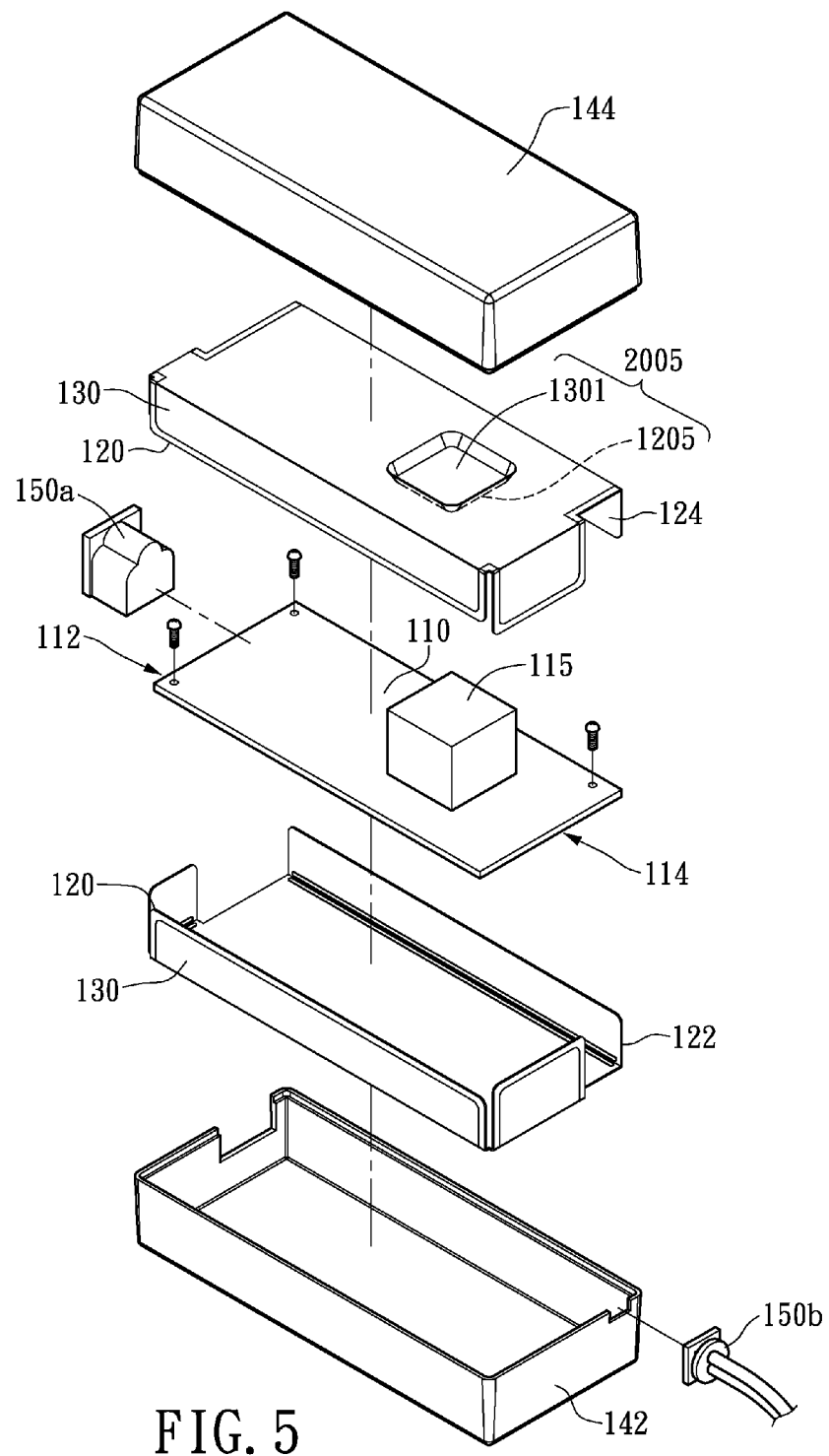
FIG. 5 illustrates an exploded view of the electronic device shown in FIG. 4.
Figure 6:
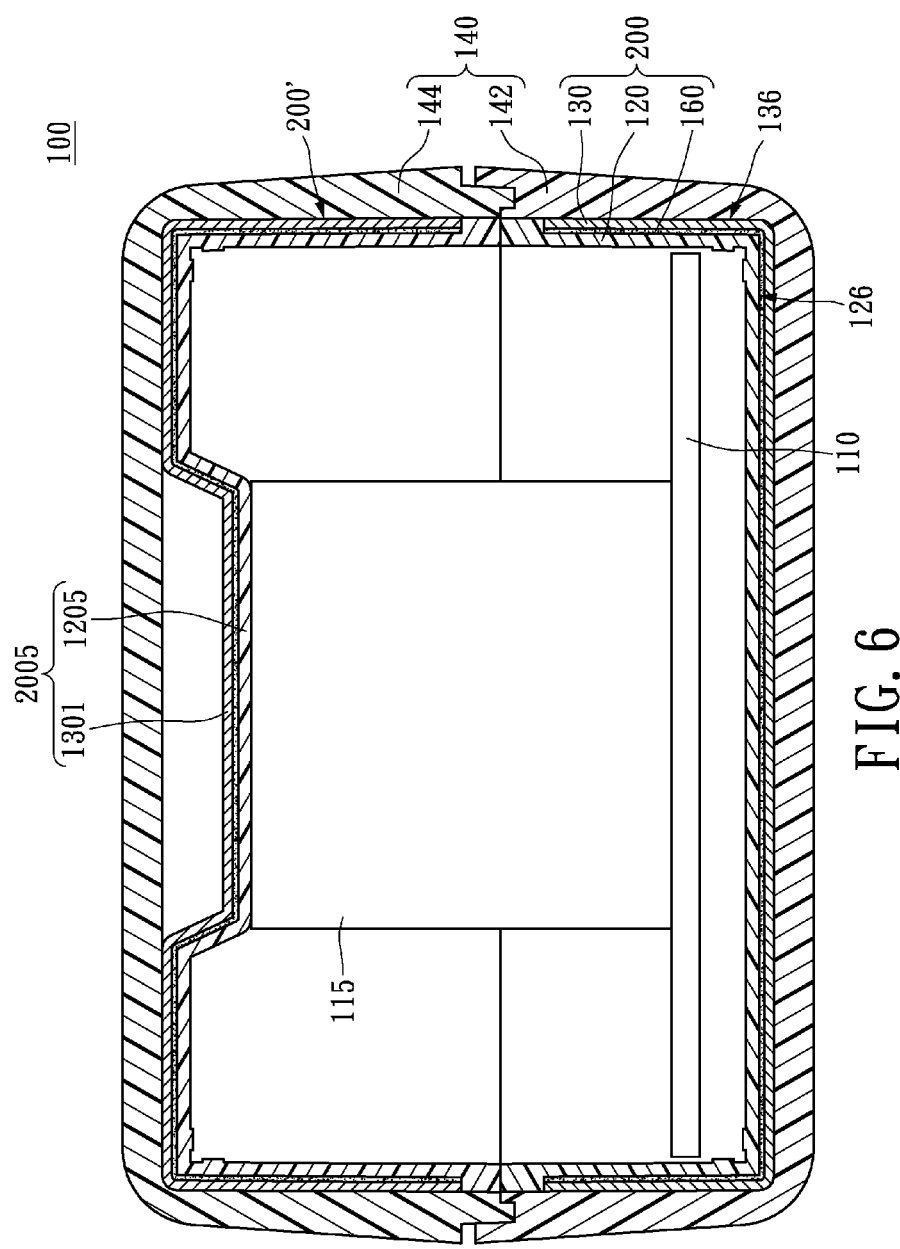
FIG. 6 illustrates a cross-sectional view along a 6-6 line in FIG. 4.

Please refer to FIG. 4~FIG. 6 illustrating applications of the folded planar heat dissipation structure. FIG. 4 shows an application of the folded first embodiment in an electronic device. FIG. 5 is an exploded view of FIG. 4. FIG. 6 is a cross sectional view of FIG. 4 along the line 6-6.

In the instant embodiment, an adapter is designated as electronic device 100. Nevertheless, the electronic device 100 is not limited to adapters and the planar heat dissipation structure can be adapted for different electronic devices; for example, a power supply, a USB digital TV tuner and the like.

In addition, in the instant embodiment, a preferred thickness of the metal layer 130 is 0.3 mm and a preferred thickness of the first electrically insulating and thermally conductive layer 120 is 0.45 mm and the thickness thereof are not limited thereto.

The electronic device 100 includes a circuit board 110, a plurality of electrical components 115 (for clarity, only one electrical component is shown in the figure), a folded planar heat dissipation structure 200 of the first embodiment and a casing 140. The electrical components 115 are electrically arranged on the circuit board 110.

In other words, the electrical components 115 are electrically connected to the circuit board 110 and can be disposed on or under the circuit board 110. The electrical components 115 can be, for example, metal-oxide-semiconductor field-effect transistors (MOSFETs), diodes, inductors, capacitors, resistors and the like.

In this and other embodiments, the term "power input component" 150a and "power output component" 150b may be respectively refer to any one of the power plug, power socket, and power cord. For the ease of reference, in the following embodiments, a power socket is used as an example of the power input component 150a (which means that a power socket can receive household power through an externally connected power plug), while a power cord is exemplified as the power output component 150b (which means that electrical connection to an electronic device, such as a laptop computer, can be established through the power cord).

According to the layout of the power input and output components 150a, 150b, the circuit board is divided into a voltage input side 112 (or a primary side) and a voltage output side 114 (or a secondary side). The voltage input side 112 refers to one side of the circuit board 110 electrically connected to the power input component 150a, whereas the voltage output side 114 refers to the other side of the circuit board 110 electrically connected to the power input component 150b.

The first electrically insulating and thermally conductive layers 120 of the respective folded planar heat dissipation structures 200 and 200' selectively cover the circuit board 110 and the electrical components 115. In this and the other embodiments (as shown in FIG. 5), the first insulating layer 120 includes a first (lower) unit 122 and a second (upper) unit 124. The first unit 122 and second unit 124 cooperatively form a complete heat dissipation structure that covers the circuit board 110 and the plurality of electrical components 115 disposed thereon.

In this embodiment, the first unit 122 and the second unit 124 cooperatively form a rectangular cuboid (a hexahedron). Particularly, the cuboid hollow heat dissipation structure is configured to only expose the power input and output components 150a, 150b through the pre-defined openings at the two opposing long ends thereof.

In other words, the insulating layer 120 cooperatively formed by the first and second units 122, 124 partially covers the voltage input and output sides 112, 114.

However, as the aforementioned definition of "cover" herein, the circuit board 110 and electrical components 115 may be covered by the first electrically insulating and thermally conductive layer 120 in different ways. For example, the first electrically insulating and thermally conductive layer 120 may be configured to only cover part of the circuit board 110, or cover some of the electrical components 115, or cover part of the circuit board 110 and some of the electrical components 115. Alternatively, the first electrically insulating and thermally conductive layer 120 may completely cover the circuit board 110 and the plurality of electrical components 115.

Moreover, the "electrically insulating" herein refers to a physical property. In the instant disclosure, the electronic device 100 is exemplified as the adapter and thus the electrically insulating characteristic is tested under the criteria of High Potential (Hi-Pot) test. In this application, after applying 4,242 volts direct current (DC) or 3,000 volts alternating current (AC) to a testing target for a specified time period, if the testing target (such as the first electrically insulating and thermally conductive layer 120 or the electronic device 100) remains stable and the dielectric breakdown does not occur, the target is defined as electrically insulating. If the instant disclosure is utilized in a different technical field, the term "electrically insulating" may refer to a different standard.

The metal layer 130 and the first electrically insulating and thermally conductive layer 120 are in thermal contact and the metal layer 130 is disposed between the first electrically insulating and thermally conductive layer 120 and the casing 140. The arrangement of the metal layer 130 combined to the first electrically insulating and thermally conductive layer 120 can be adjusted according to different safety requirements or specific heat dissipation needs of the electronic device 100. That is to say, the first electrically insulating and thermally conductive layer 120 and the metal layer 130 may have different sizes and cover different areas.

As shown in FIG. 4 and FIG. 6, in order to satisfy the safety requirement of the adapters, the metal layer 130 is indented accordingly. For example, the metal layer 130 shrinks at least 2 millimeters inwardly along the original margin, preferably reducing up to 2.5 millimeters, and the range of indentation is not limited thereto. Alternatively, the metal layer 130 can be used at specific regions only as desired.

The casing 140 has a generally hollow body that defines an accommodating space P. In the instant embodiment, the casing 140 includes a first casing 142 and a second casing 144 and the circuit board 110 is disposed in the first casing 142. The second casing 144 covers onto the first casing 142 and together the first and second casings 142, 144 receive the circuit board 110, plurality of electrical components 115 and folded planar heat dissipation structures 200, 200' in the accommodating space P. The circuit board 110 and the plurality of electrical components 115 are covered by the planar heat dissipation structures 200, 200'.

In addition, the casing 140 includes an upper surface 140a, a bottom surface 140b, a right surface 140c, a left surface 140d, an electric power input side surface 140e and an electrical power output side surface 140f. The top, bottom, right, left, power input side and power output side surfaces 140a, 140b, 140c, 140d, 140e, 140f together form the hollow interior of the casing 140.

The folded planar heat dissipation structures 200 and 200' abut the interior of the casing 140 to form a hollow hexahedral structure.

The first insulating layer 120 of the folded planar heat dissipation structures 200 and 200' partially covers of the voltage input and output sides 112, 114. In some applications, the casing 140 can be made of plastic; however, other suitable materials can be used in other applications. The material thereof is not limited thereto. Additionally, the folded planar heat dissipation structures 200 and 200' can be assembled in a tight-fitting manner into the casing 140.

In assembling the electronic device 100, an operator inserts the folded planar heat dissipation structures 200, 200' or 200" into the casing 140 to abut the interior thereof and the engagement process is done. The tight fit engagement shortens assembly time and promotes the production efficiency.

The folded planar heat dissipation structures 200, 200', and 200" selectively contact the circuit board 110 and the electrical components 115. In the instant disclosure, the folded planar heat dissipation structure 200' abuts the electrical component 115 via the second bump portion 1205 of the hollow protrusion 2005. Thus, the distance between the first electrically insulating and thermally conductive layer 120 and the electrical component 115 decreases and the heat is transferred more quickly.

It is worth to note that the outline of the second bump portion 1205 can be modified according to the outline of different electrical components 115 and the structure thereof is not limited thereto.

A gap is formed between the first bump portion 1301 and the adjacent casing 140 (i.e. the second casing 144) to avoid direct heat dissipation to the corresponding area of the second casing 144 therefore reducing the hot spot temperature on the casing 140.

The heat dissipation mechanism of the electronic device 100 is discussed herein. When the electronic device 100 is under operation, the heat generated by the circuit board 110 or the electrical components 115 is transferred to the first electrically insulating and thermally conductive layer 120 by thermal convection. Alternatively, the heat may be transferred by thermal conduction; for example, the electrical component 115 abuts the second bump portion 1205 providing a heat conduction path.

As the heat is transferred from the first electrically insulating and thermally conductive layer 120 to the metal layer 130, the heat diffuses and spreads evenly to the planar heat dissipation structures 200 and 200' for a uniform temperature. The gap between the first bump portion 1301 and the second casing 144 reduces the hot spot temperature on the casing 144.

Subsequently, in the heat conducting process from the metal layer 130 to the casing 140, because the metal layer 130 has a higher thermal conductivity coefficient than that of the first electrically insulating and thermally conductive layer 120, and the heat conduction rate is quicker in the metal layer 130 than in the first electrically insulating and thermally conductive layer 120. Thus, compared to the surface 126 of the first electrically insulating and thermally conductive layer 120, the temperature of the surface 136 of the metal layer 130 can be even more equally distributed.

The heat then disperses to the surrounding environment via the casing 140. In the heat dissipation process from the circuit board 110 and the electrical component 115 to the casing 140, because heat has already been evenly distributed among the first electrically insulating and thermally conductive layer 120 and the metal layer 130 before being transferred to the casing 140, therefore, when compared to the conventional planar heat dissipation structure, the temperature distribution on the casing 140 of the instant disclosure can achieve higher degree of uniformity, which leads to higher degree of heat dissipation efficiency.

Hence, the folded planar heat dissipation structures 200 and 200' in accordance with the instant disclosure can greatly reduce the hot spot temperature on the casing 140 to allow better heat dissipation efficiency.

Additionally, the thickness of the instant disclosure in general is thinner than the conventional planar heat dissipation structure, therefore yielding more interior space inside the electronic device 100.

Third Embodiment

Figure 7:
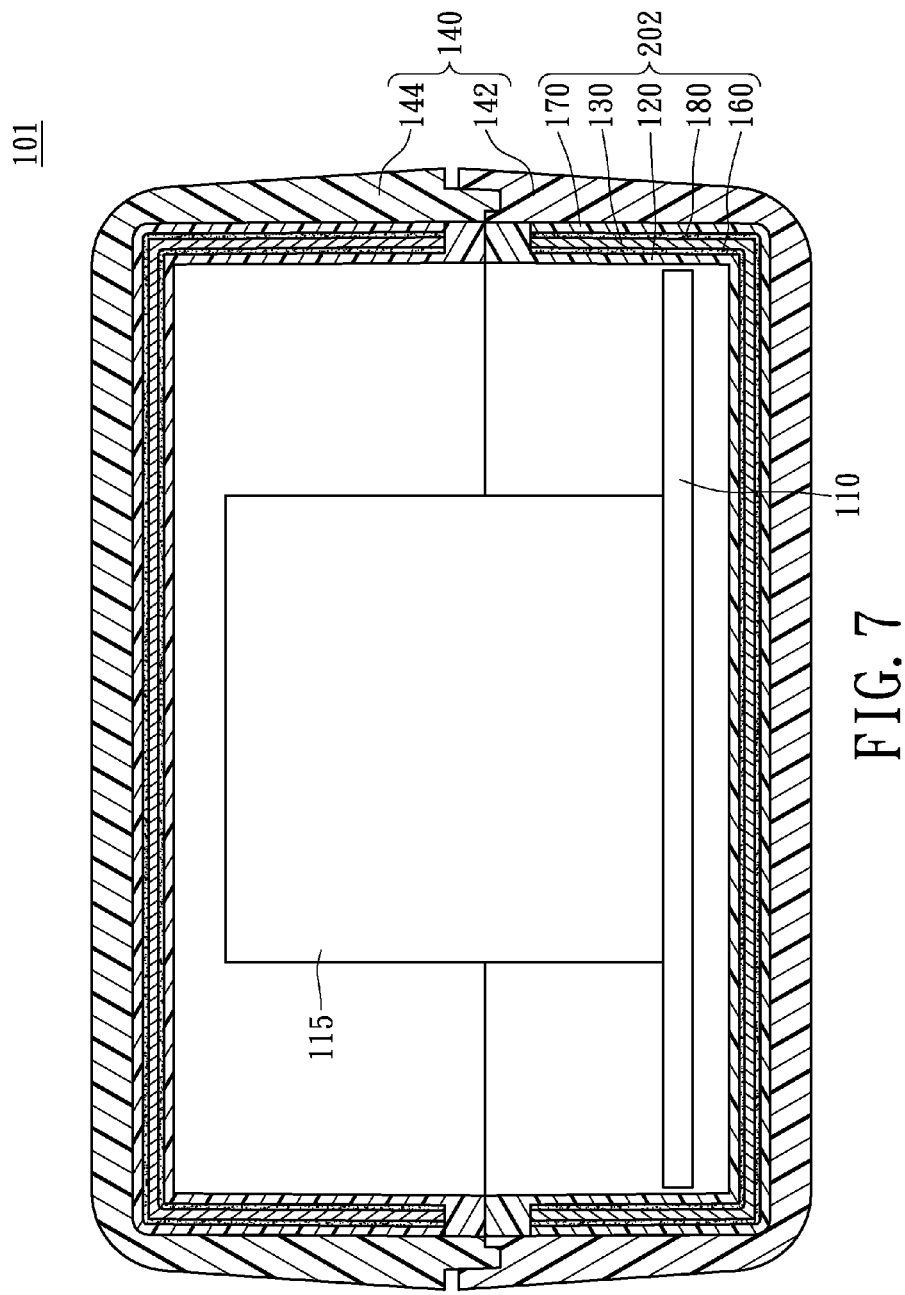
FIG. 7 illustrates a cross-sectional view in accordance with a third embodiment of the instant disclosure.

Please refer to FIG. 7, which illustrates a cross sectional view of a folded planar heat dissipation structure in an electronic device 101 of a third embodiment. The same reference numerals are used in various figures to represents the same or similar elements described previously.

In addition to the first electrically insulating and thermally conductive dissipation structure 120 and metal layer 130, the difference of the planar heat dissipation structure 202 arises from a second electrically insulating and thermally conductive layer 170 (interchangeably referred to as the "second insulating layer" 170 for the ease of reference). Preferably, the first and second electrically insulating and thermally conductive layers 120, 170 cover the metal layer 130 to satisfy specific safety regulations.

In other words, the metal layer 130 is sandwiched between the first and second electrically insulating and thermally conductive layers 120, 170. The second electrically insulating and thermally conductive layer 170 has a a thermal conductivity coefficient greater than 0.5 W/mK and the second electrically insulating and thermally conductive layer 170 can be made of heat conductive rubber or heat conductive silicone.

Because the second electrically insulating and thermally conductive layer 170 is made of relatively soft material having higher degree of flexibility compared with the metal layer 130, the adaptation between the casing 140 and the second insulating layer 170 is higher, therefore, heat transfer from the electrical component 115 to the surface of the casing 140 can be more effectively as a result, thus more efficiently and quickly cooling the electronic component 115. In other words, the instant disclosure is particularly suitable for used in an electronic device to facilitate highly efficient heat dissipation from a high power-consumption electric component 115 to the surface of the casing 140.

The second electrically insulating and thermally conductive layer 170 is combined with the metal layer 130 preferably by chemical bonding and preferably integrates with the first electrically insulating and thermally conductive layer 120 to completely cover the metal layer 130 and form the one-piece planar heat dissipation structure 202.

The planar heat dissipation structure 202 comprises a second adhesive 180. Preferably, the second electrically insulating and thermally conductive layer 170 is thermal conductively combined with the metal layer 130 via the second adhesive 180 through chemical bonding, in a fashion similar to that discussed in the first embodiment. The exact detail of the chemical bonding is therefore not repeated.

The combination of the first electrically insulating and thermally conductive layer 120 and the metal layer 130 is not limited to chemical bonding. Other chemical and adhesion promoter may also be employed to allow thermal contact between the first electrically insulating and thermally conductive layer 120 and metal layer 130. Moreover, herein further describes other different combinations.

Fourth Embodiment

Figure 8:
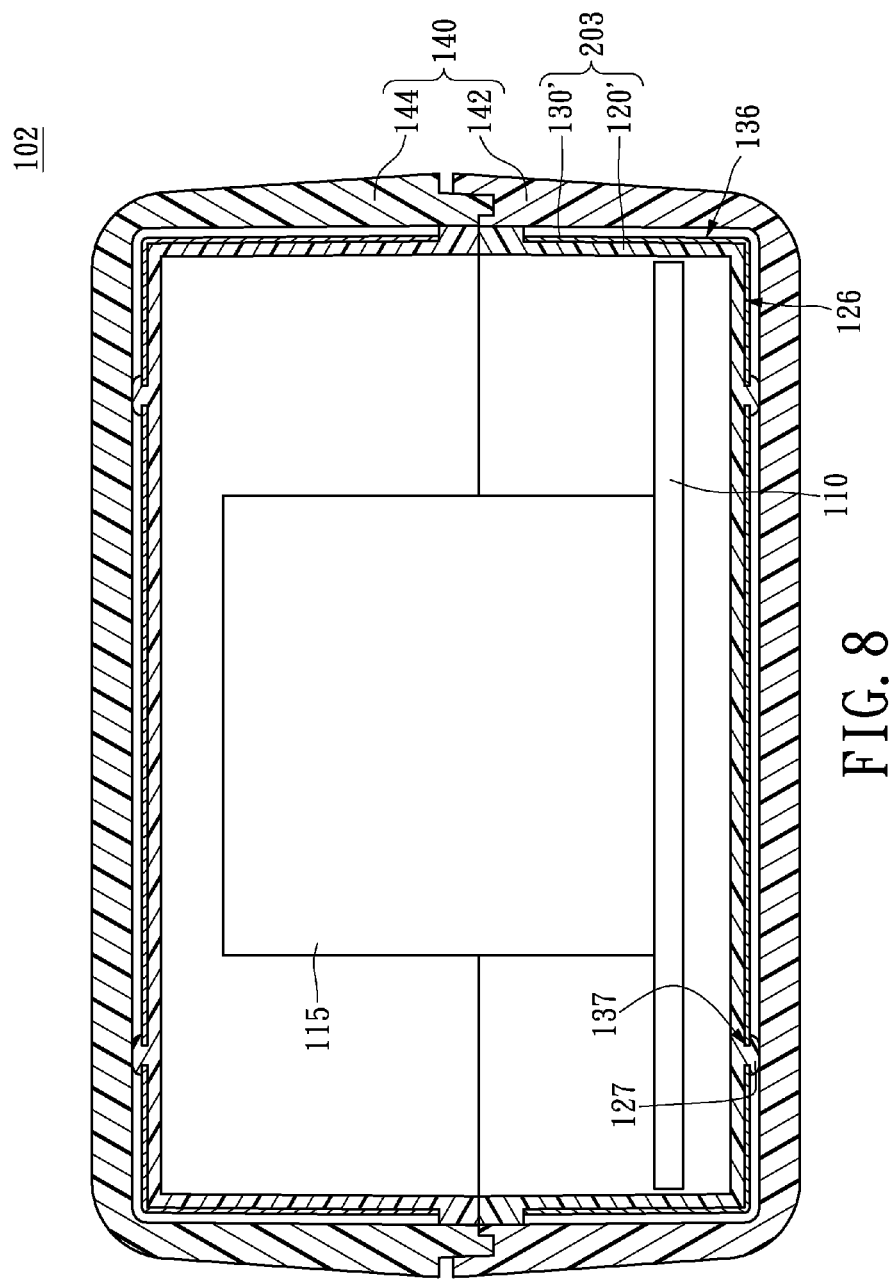
FIG. 8 illustrates a cross-sectional view in accordance with a fourth embodiment of the instant disclosure.

Please refer to FIG. 8 illustrating a folded planar heat dissipation structure in an electronic device in accordance with a fourth embodiment of the instant disclosure. The associated reference numerals are based on the second embodiment.

The planar heat dissipation structure 120' of the electronic device 102 includes a coupling portion 127. The coupling portion 127 projects toward the casing 140 from the first electrically insulating and thermally conductive layer 120' and penetrates a hole 137 of the metal layer 130'. The coupling portion 127 extends outside the hole 137 to form as a rivet, thus engaging the first electrically insulating and thermally conductive layer 120' thereto to form a one-piece planar heat dissipation structure 203.

In the manufacturing of the planar heat dissipation structure 203, a metal plate is first punched to form the hole 137. Then, an electrically insulating and thermally conductive sheet is placed on the metal plate. The metal plate and the electrically insulating and thermally conductive sheet are heated and compressed by a mold so that a part of the electrically insulating and thermally conductive sheet penetrates through the hole 137 to form the coupling portion 127 so as to combine the first electrically insulating and thermally conductive layer 120' with the metal layer 130'.

Fifth Embodiment

Figure 9:
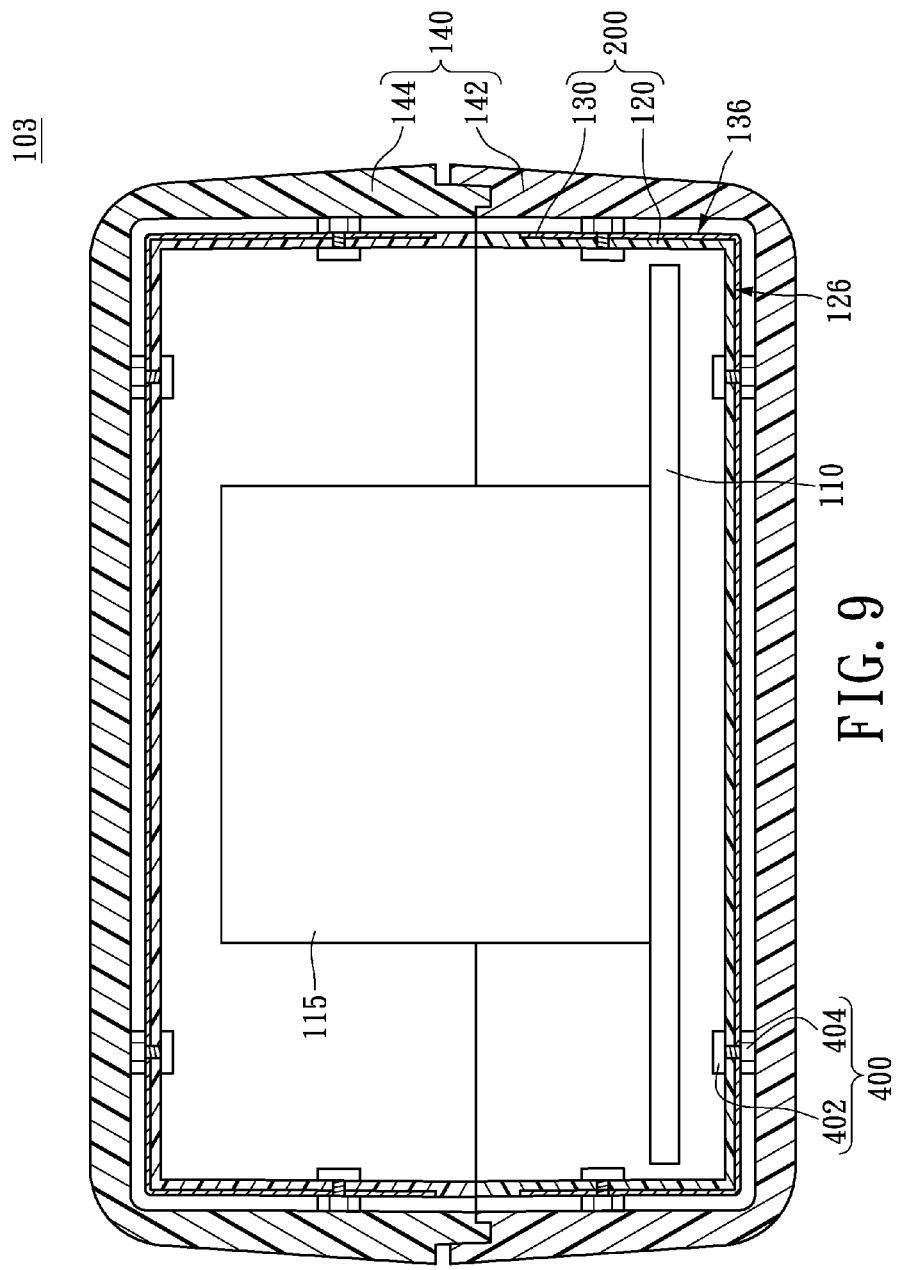
FIG. 9 illustrates a cross-sectional view in accordance with a fifth embodiment of the instant disclosure.

Please refer to FIG. 9 illustrating a cross sectional view of a folded planar heat dissipation structure applied in an electronic device in accordance with a fifth embodiment of the instant disclosure. The associated reference numerals are in accordance with the second embodiment. The first insulating and heat conduction layer 120 in the electronic device 103 can also be in thermal contact with the metal layer 130 through an electric insulating fastener 400, such as a plastic screw 402 and a plastic nut 404.

Sixth Embodiment

Figure 10:
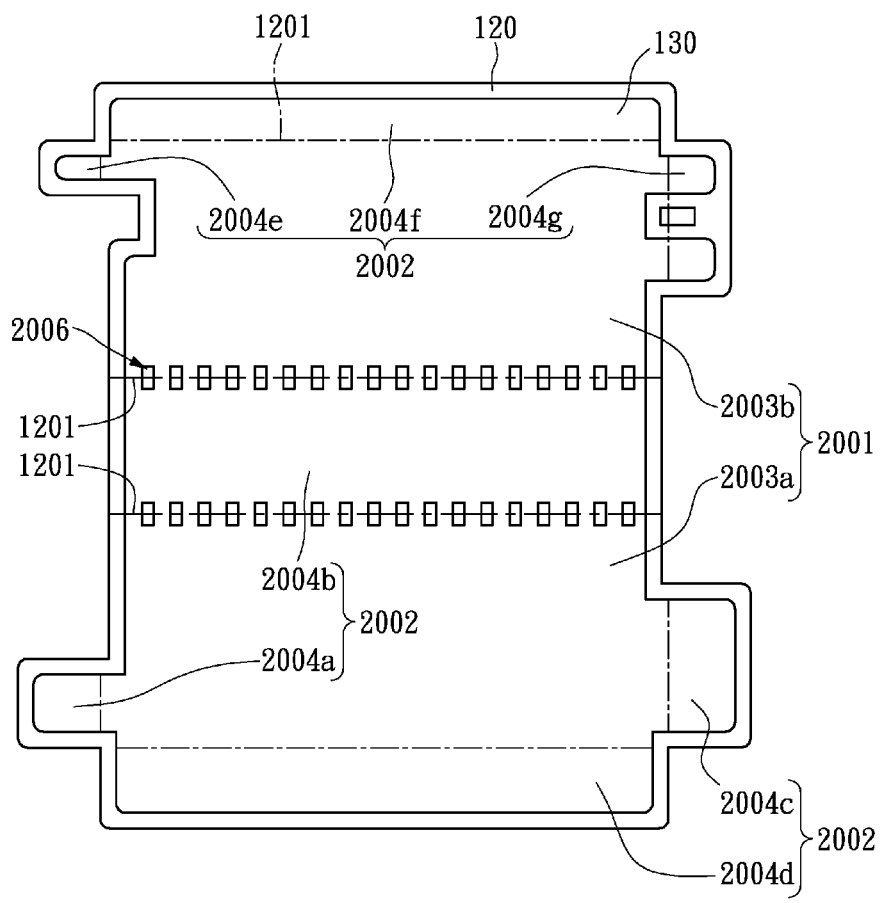
FIG. 10 illustrates a cross-sectional view in accordance with a sixth embodiment of the instant disclosure.
Figure 11:
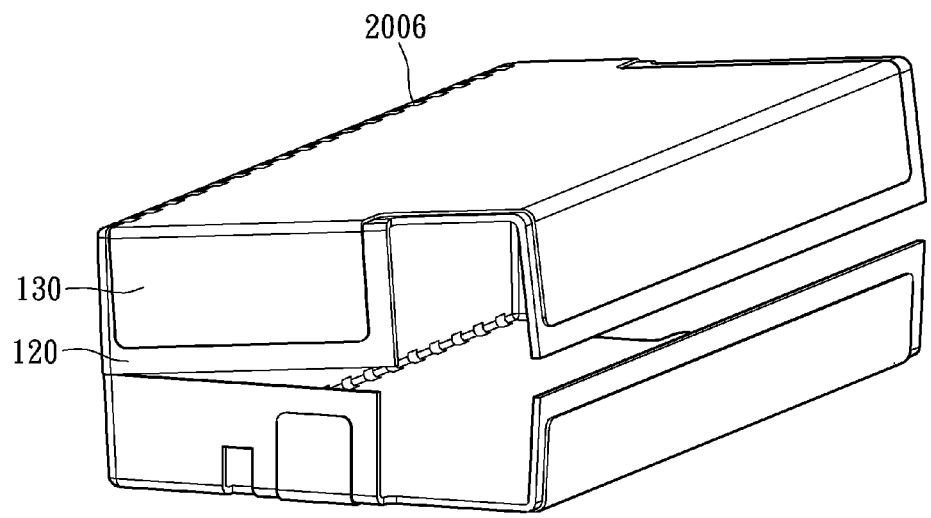
FIG. 11 illustrates a perspective view of a folded planar heat dissipation structure in accordance with a sixth embodiment of the instant disclosure.

Please refer to FIG. 10 illustrating a schematic diagram of a variation of the first embodiment. FIG. 11 is a schematic diagram showing the folded variation. The reference numerals of the associated members are designated in accordance with the first embodiment.

In the instant embodiment, the planar heat dissipation structure 204 differs from the first embodiment in that each planar heat dissipation structure 204 in the instant embodiment is individually configured to form an enclosing three-dimensional structure. However, the structural shape of the planar heat dissipation structure 204 need not be limited to a cuboid/hexahedron; other enclosing structural shapes (for instance, a cylinder) can be achieved according to specific operational requirements or other design considerations.

Specifically, a plurality of score lines 1201 are defined on the first electrically insulating and thermally conductive layer 120. The planar heat dissipation structure may be divided by the score lines 1201 into two substantially identically shaped base portions 2003a, 2003b (with correspondingly similar layout arrangements) and a plurality of the flat portions 2004a~2004g. The two base portions 2003a and 2003b of the base portion 2001 are in connection through the flat portion 2004b of the flap portion 2002.

It is worth noted that, in this embodiment, some of the score lines (e.g. 1201) defined between the two base portions 2003a/b and the interconnecting flat portion 2004b are formed with a plurality of spacedly arranged thru-openings 2006 thereon. Thus, during the manufacture of the planar heat dissipation structure 204, the metal layer 130 may be retained on the positioning posts of the mould through the openings 2006, which in turn offers better positioning/fixation of the work pieces, thus benefits the subsequent formation process of the first electrically insulating and thermally conductive layer 120.

The planar heat dissipation structure 204 can also be modified and used in the second to fifth embodiment of the instant disclosure.

In summary, the instantly disclosed planar heat dissipation structure, when being formed by combining the first electrically insulating and thermally conductive layer and the metal layer through chemical bonding, allows even pressure and temperature distribution during the molding process, which in turn facilitates increased production rate and reduced production cost.

Further, the planar heat dissipation structure can be stacked one over another compactly to reduce packaging size. Compared to the conventional three-dimensional planar heat dissipation structure, the instant disclosure occupies 5 times less space which can lower transportation cost.

Furthermore, the metal layer is formed with the first bump portion and the first electrically insulating and thermally conductive layer is formed with a second bump portion, which corresponds to and covers the first bump portion and abuts the electrical components. The second bump portion reduces the distance between the first electrically insulating and thermally conductive layer and the electrical components to allow fast heat dissipation. Additionally, a gap is preferably formed between the casing of the electronic device and the first bump portion so as to reduce the hot spot temperature of the casing.

Additionally, because the first bump portion of the metal layer is formed prior to the formation of the second bump portion of the first electrically insulating and thermally conductive layer onto the first bump portion, compared to the arrangements that utilize solid bumps made of insulating material on the first electrically insulating and thermally conductive layer, the structural arrangement of the second bump portion in the instant disclosure enables the reduction of material usage of the electrically insulating and thermally conductive material.

In addition, since the first or/and second electrically insulating and thermally conductive layer in the disclosure can be made of soft materials such as heat conductive rubber or heat conductive silicone, the first or/and second electrically insulating and thermally conductive layer can effectively absorb the structural variation such as warping or brittle fracturing which is caused by the different thermal expansion coefficients of the first or/and second electrically insulating and thermally conductive layer and the metal layer when the first or/and second electrically insulating and thermally conductive layer are combined with the metal layer. Therefore, the electronic device employing the folded planar heat dissipation structure disclosed herein can pass the thermal shock test. Furthermore, the first or/and the second electrically insulating and thermally conductive layer can effectively absorb the noise produced by the vibration of the electronic components in the electronic device. Thus, the electronic device employing the folded planar heat dissipation structure disclosed herein can pass the noise test.

According to the above-mentioned embodiments and other derived and varied embodiments, the folded planar heat dissipation structure of the disclosure can distribute uniformly the temperature on the surface of the casing and can effectively reduce the temperatures of the hot spots on the surface of the casing, compared with the conventional heat dissipation structure. Furthermore, the working procedures, the assembling hours, and the number of workers can be reduced effectively so as to reduce the cost and improve the yield rate.

The insulation requirements for safety regulations and various mechanical tests can also be met. The planar heat dissipation structure of the disclosure can be flexibly designed according to the different heat dissipation requirements of the electronic device; that is, the designs for the casing and the heat dissipation structure can be cooperated in favor of reduction of the temperatures of the hot spots on the surface of the casing or the high temperatures of the electronic components in the electronic device.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A planar heat dissipation structure comprising:
   a first electrically insulating and thermally conductive layer having a thermal conductivity coefficient greater than 0.5 W/mK; and
   a metal layer chemically bonded to and in thermal contact with the first electrically insulating and thermally conductive layer, thereby integrally forming the planar heat dissipation structure of one-piece construction that is configurable in a collapsed state;
   wherein the planar heat dissipation structure defines a base portion and at least one flap portion configured to be foldable with respect to the base portion, such that the first electrically insulating and thermally conductive layer constitutes an inner surface of the planar heat dissipation structure in a folded state to define a covering space,
   wherein the first electrically insulating and thermally conductive layer has at least one score line defined thereon between the base and the flap portions thereof, wherein the flap portion is foldable with respect to the base portion along the score line;
   wherein the first electrically insulating and thermally conductive layer comprises a first rib protrudingly formed on a surface thereof and extending substantially along the score line proximate the base portion;
   wherein the first electrically insulating and thermally conductive layer comprises a second rib protrudingly formed on the surface thereof and extending along the score line proximate the flap portion; and
   wherein a valley defined between the first and second ribs provides room of accommodation for receiving bulged material of the first electrically insulated and thermally conductive layer upon folding.

2. The planar heat dissipation structure according to claim 1, wherein the planar area of the metal layer is not greater than the planar area of the first electrically insulating and thermally conductive layer.

3. The planar heat dissipation structure according to claim 1, wherein a portion between the flap portion and the base portion along which the flap portion is folded with respect to the base portion has a curved profile.

4. The planar heat dissipation structure according to claim 1, wherein the metal layer is formed with a hollow first bump portion, wherein the first electrically insulating and thermally conductive layer is formed with a hollow second bump portion correspondingly configured to cover the first bump portion.

5. The planar heat dissipation structure according to claim 1, wherein the base portion includes two substantially identical base portions and the at least one flap includes a plurality of flap portions, the two base portions being in connection through one of the flap portions, wherein the flap portions are respectively foldable with respect to the base portions to form an enclosing three-dimensional structure.

6. The planar heat dissipation structure according to claim 5, wherein a planar area of the metal layer is not greater than a planar area of the first electrically insulating and thermally conductive layer.

7. The planar heat dissipation structure according to claim 1, further comprising a second electrically insulating and thermally conductive layer having a thermal conductivity coefficient greater than 0.5 W/mK in thermal contact with the metal layer, wherein the metal layer is sandwiched between the first and second electrically insulating and thermally conductive layers.

8. A planar heat dissipation structure foldable to form a three-dimensional structure that defines a covering space, suitable for use in the casing of an electronic device for covering a circuit board and/or at least one electrical component thereof, the planar heat dissipation structure comprising:
   a first electrically insulating and thermally conductive layer having a thermal conductivity coefficient greater than 0.5 W/mK; and
   a metal layer chemically bonded to and in thermal contact with the first electrically insulating and thermally conductive layer, thereby integrally forming the planar heat dissipation structure of one-piece construction that is configurable in a collapsed state;
   wherein the planar heat dissipation structure defines a base portion and at least one flap portion configured to be foldable with respect to the base portion, such that the first electrically insulating and thermally conductive layer constitutes an inner surface of the planar heat dissipation structure in a folded state to define the covering space,
   wherein the first electrically insulating and thermally conductive layer has at least one score line defined thereon between the base and the flap portions thereof, wherein the flap portion is foldable with respect to the base portion along the score line;
   wherein the first electrically insulating and thermally conductive layer comprises a first rib protrudingly formed on a surface thereof and extending substantially along the score line proximate the base portion;
   wherein the first electrically insulating and thermally conductive layer comprises a second rib protrudingly formed on the surface thereof and extending along the score line proximate the flap portion; and
   wherein a valley defined between the first and second ribs provides room of accommodation for receiving bulged material of the first electrically insulated and thermally conductive layer upon folding.

9. The planar heat dissipation structure according to claim 8, wherein a planar area of the metal layer is not greater than a planar area of the first electrically insulating and thermally conductive layer.

10. An electronic device, comprising:
   a circuit board;
   at least one electrical component electrically connected to the circuit board;
   a folded planar heat dissipation structure, including:
      a first electrically insulating and thermally conductive layer having thermal conductivity coefficient greater than 0.5 W/mK, and
      a metal layer chemically bonded to and in thermal contact with the first electrically insulating and thermally conductive layer, thereby integrally forming the planar heat dissipation structure of one-piece construction that is configurable in a collapsed state,
      wherein the planar heat dissipation structure defines a base portion and at least one flap portion configured to be foldable with respect to the base portion, such that the first electrically insulating and thermally conductive layer constitutes an inner surface of the planar heat dissipation structure in a folded state to define a covering space,
   wherein the first electrically insulating and thermally conductive layer selectively covers the circuit board and the electrical component,
      wherein the first electrically insulating and thermally conductive layer has at least one score line defined thereon between the base and the flap portions thereof, wherein the flap portion is foldable with respect to the base portion along the score line;
      wherein the first electrically insulating and thermally conductive layer comprises a first rib protrudingly formed on a surface thereof and extending substantially along the score line proximate the base portion;
      wherein the first electrically insulating and thermally conductive layer comprises a second rib protrudingly formed on the surface thereof and extending along the score line proximate the flap portion; and
      wherein a valley defined between the first and second ribs provides room of accommodation for receiving bulged material of the first electrically insulated and thermally conductive layer upon folding; and
   a casing, defining an accommodating space in which the circuit board, the electrical component, and the folded planar heat dissipation structure are accommodated,
   wherein the metal layer situates between the casing and the first electrically insulating and thermally conductive layer.

11. The planar heat dissipation structure according to claim 10, wherein a planar area of the metal layer is not greater than a planar area of the first electrically insulating and thermally conductive layer.

12. The electronic device according to claim 10, wherein the metal layer is formed with a hollow first bump portion, wherein the first electrically insulating and thermally conductive layer is formed with a hollow second bump portion correspondingly configured to cover the first bump portion, wherein both the first and second bumps portions protrude inwardly toward the accommodating space, the second bump portion being proximate to or abutting the at least one of electrical component or the circuit board.

13. The electronic device according to claim 10, wherein the first electrically insulating and thermally conductive layer defines two substantially identical base portions and a plurality of flap portions, the two base portions being in connection through one of the flap portions, wherein the flap portions are respectively foldable with respect to the base portions to form an enclosing three-dimensional structure.

14. The electronic device according to claim 10, wherein the electronic device is an adapter or a power supply.

* * * * *